US007362586B2

(12) United States Patent
Mashimo et al.

(10) Patent No.: US 7,362,586 B2
(45) Date of Patent: Apr. 22, 2008

(54) ELECTRONIC COMPONENT WITH SHIELDING CASE AND METHOD OF MANUFACTURING THE SAME

(75) Inventors: Yoshiyuki Mashimo, Komatsu (JP); Masao Uno, Ishikawa-ken (JP); Toru Yaoeda, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 80 days.

(21) Appl. No.: 11/049,429

(22) Filed: Feb. 2, 2005

(65) Prior Publication Data

US 2005/0248927 A1 Nov. 10, 2005

(30) Foreign Application Priority Data

May 7, 2004 (JP) ............................ 2004-139031

(51) Int. Cl.
*H05K 7/02* (2006.01)

(52) U.S. Cl. ...................... 361/736; 361/728; 361/730; 361/800; 29/830; 310/320; 174/260

(58) Field of Classification Search ................ 361/736, 361/760, 761, 795, 728–730, 800; 174/260; 29/830; 310/320
See application file for complete search history.

(56) References Cited

U.S. PATENT DOCUMENTS 5,488,765 A * 2/1996 Kubota et al. ................ 29/593
5,635,669 A * 6/1997 Kubota et al. .............. 174/524
5,635,670 A * 6/1997 Kubota et al. .............. 174/524
5,966,052 A * 10/1999 Sakai .......................... 331/68
6,025,998 A * 2/2000 Kitade et al. ............... 361/800
6,079,099 A * 6/2000 Uchida et al. ................ 29/837
6,538,896 B2 * 3/2003 Kameda et al. ............. 361/752
6,760,227 B2 * 7/2004 Sakai et al. ................. 361/736
6,788,545 B2 * 9/2004 Nakayama .................. 361/752
6,798,665 B2 * 9/2004 Kimura ...................... 361/736
D514,074 S * 1/2006 Kamidoi et al. ........... D13/182
7,126,057 B2 * 10/2006 Ogawa et al. .............. 174/535
2002/0177360 A1 * 11/2002 Nakayama .................. 439/620

FOREIGN PATENT DOCUMENTS

JP 09-153696 6/1997
JP 10-012808 1/1998
JP 10-013078 1/1998
JP 2001-148594 5/2001
JP 2003-152287 5/2003
JP 2003-178928 6/2003

OTHER PUBLICATIONS

Official Communication issued in the corresponding Chinese Application No. 200510054517X, mailed on Dec. 8, 2006.

* cited by examiner

*Primary Examiner*—Tuan T. Dinh
*Assistant Examiner*—Dameon E. Levi
(74) *Attorney, Agent, or Firm*—Keating & Bennett, LLP

(57) ABSTRACT

Shielding cases each include a pair of opposed first surfaces with catching pieces protruding therefrom and a pair of second surfaces without catching pieces. A motherboard forms substrates each including a pair of opposed first side surfaces with catching grooves and a pair of second side surfaces without catching grooves when it is divided. The shielding cases are mounted on the motherboard such that the intervals A between the second surfaces of two adjacent shielding cases are equal to or less than the widths B of cutting allowances for cutting the motherboard. The motherboard is cut from the opposite side of a surface of the motherboard on which the shielding cases are mounted at predetermined positions where the second side surfaces are formed on each substrate. In this manner, the motherboard is divided into electronic components with shielding cases.

11 Claims, 6 Drawing Sheets

ELECTRONIC COMPONENT WITH SHIELDING CASE AND METHOD OF MANUFACTURING THE SAME

BACKGROUND OF THE INVENTION

1. Field of the Invention

The present invention relates to electronic components. In particular, the present invention relates to electronic components with shielding cases accommodating surface mount devices mounted on the substrates in the same manner as high-frequency composite components such as voltage controlled oscillators (VOCs) or phase-locked loop (PLL) modules, and relates to methods of manufacturing the same.

2. Description of the Related Art

FIG. 6 is a perspective view of a known electronic component with a shielding case (See Japanese Unexamined Patent Application Publication No. 2001-148594). This electronic component includes a substrate 51, a surface mount device (not shown) mounted on the top surface 51*a* of the substrate 51, and a shielding case 53 accommodating the substrate 51 and the surface mount device.

The substrate 51 includes four side surfaces each having a plurality of catching grooves 54 for mounting the shielding case 53. The catching grooves 54 are parts of through holes, and electrodes are provided on the inner surfaces of the catching grooves 54. Land electrodes 58 are formed on the top surface 51*a* of the substrate 51 around the catching grooves 54 for electrical connection between the substrate 51 and substrate-opposing portions 53*a* of the shielding case 53.

The shielding case 53 includes a casing body 55 accommodating the surface mount device (not shown), and a plurality of catching pieces 56 fitted into the catching grooves 54 of the substrate 51.

The catching pieces 56 formed on respective sides of the shielding case 53 are soldered to the electrodes formed on the inner surfaces of the catching grooves 54 while the catching pieces 56 are fitted into the catching grooves 54 of the substrate 51. In this manner, the shielding case 53 is fixed to the substrate 51.

In order to produce electronic components with shielding cases having the above-described substrate, surface mount devices are mounted on a motherboard that will be divided into a plurality of substrates later, and shielding cases are fixed to the motherboard by fitting and soldering catching pieces of shielding cases to through holes bored through the motherboard. The motherboard is then cut with a cutting device such as a dicer at predetermined positions where the through holes are divided into the catching grooves. In this manner, the electronic components with the shielding cases are produced.

Therefore, intervals between two adjacent shielding cases mounted on the motherboard must be sufficiently wide such that the cutting device, for example, a dicing blade, can pass through the intervals. In consideration of various errors such as a positional misalignment during dicing, an initial positional misalignment of the cutting device, and a dimensional deviation of the motherboard, the intervals should include margins to compensate for the above-described errors in addition to cutting allowances depending on the width of the dicing blade. As a result, the number of the intervals between two adjacent shielding cases is increased with the number of the electronic components produced from one motherboard. This leads to a reduction in the available area of the motherboard and an increase in cost.

SUMMARY OF THE INVENTION

In order to overcome the problems described above, preferred embodiments of the present invention provide methods of manufacturing electronic components with shielding cases leading to an increase in the available area of a motherboard, a reduction in cost, and downsizing of the electronic components, and preferred embodiments of the present invention also provide an electronic component with a shielding case produced by the novel methods of other preferred embodiments of the present invention.

In a first preferred embodiment of the present invention, a method of manufacturing electronic components with shielding cases includes the steps of preparing a motherboard including through holes and electrodes formed on the inner surfaces of the through holes, preparing shielding cases each having a casing body including a pair of opposed first surfaces with catching pieces protruding therefrom and a pair of second surfaces without catching pieces, mounting the shielding cases on the motherboard by fitting and soldering the catching pieces of the shielding cases to the through holes of the motherboard so as to cover respective substrates formed by dividing the motherboard, and dividing the motherboard into electronic components with shielding cases by cutting the motherboard with a dicing blade from the opposite side of a surface of the motherboard on which the shielding cases are mounted to a depth where the dicing blade does not come into contact with the shielding cases at positions where opposed first side surfaces with catching grooves formed by dividing the through holes are formed on each substrate and at positions where opposed second side surfaces without catching grooves are formed on each substrate.

According to the first preferred embodiment of the invention, the available area of the motherboard can be increased and costs can be reduced. Moreover, the size of the substrates can be minimized compared to the shielding cases, and thus the electronic components can be greatly decreased in size.

In the above-described method of manufacturing the electronic components, the outer dimension of the electronic components is determined by the dimension of the substrates after cutting. According to the first preferred embodiment of the present invention, the catching pieces are preferably formed only on the first surfaces of the shielding cases. Therefore, the shielding cases can be arranged on the motherboard in a high density at the second surfaces, and the motherboard can be cut at the second surfaces regardless of a certain amount of positional misalignment. As a result, packaging density of the shielding cases can be increased at the second surfaces, and the electronic components can be downsized by cutting the motherboard at boundaries between the shielding cases. This leads to an increase in available area of the motherboard and a reduction in cost.

At the second surfaces, the shielding cases are disposed above the surface of the motherboard, and thus a cutting device such as a dicing blade does not hit and cut the shielding cases even when the intervals between the shielding cases are small. Therefore, the shielding cases are not cut at unintended positions even when the shielding cases are arranged in a high packaging density, and reliability in the manufacturing process is ensured.

As described above, according to the first preferred embodiment of the present invention, the dimension of the electronic components can be downsized to substantially the same size of the outer dimension of the shielding cases. Since the areas available to mount elements inside the shielding cases can be expanded, the electronic components can be downsized for the same functions, and the electronic components can be multifunctional with high performance for the same dimensions.

In a second preferred embodiment of the present invention, the method of manufacturing the electronic components is characterized in that the intervals A between the second surfaces of two adjacent shielding cases mounted on the motherboard are equal to or less than the widths B of cutting allowances at the positions where the opposed second side surfaces without catching grooves are formed on each substrate when the motherboard is cut.

According to the second preferred embodiment of the present invention, the distance between the second side surfaces of one substrate can be narrower than the distance between the second surfaces of one shielding case. Therefore, the electronic components can be downsized to facilitate the effective use of the motherboard and to reduce costs.

Compared with the known electronic components, the electronic components according to preferred embodiments of the present invention can have a reduced dimension of the substrates relative to the dimension of the shielding cases, in other words, the size of the shielding cases can be increased relative to the size of the substrates. Since the areas available to mount elements inside the shielding cases can be expanded, the electronic components can be downsized for the same functions, and the electronic components can be multifunctional with high performance for the same dimensions.

In a third preferred embodiment of the present invention, the method of manufacturing the electronic components is characterized in that when the shielding cases mounted on the motherboard are connected to each other, the connecting portions of the shielding cases are cut during cutting of the motherboard in the above-described step of dividing the motherboard.

According to the third preferred embodiment of the present invention, the manufacturing process can be simplified, and the electronic components can be more efficiently produced.

In a fourth preferred embodiment of the present invention, an electronic component with a shielding case includes a substrate including a pair of opposed first side surfaces each having a catching groove for mounting a shielding case, and a pair of second side surfaces each having no catching grooves, the catching groove being part of a through hole including an electrode on the inner surface thereof, the axial direction of the through hole being approximately along the thickness direction of the substrate, a surface mount device mounted on the top surface of the substrate, and a shielding case having a casing body covering the top surface of the substrate and fixed to the substrate, the casing body including a pair of opposed first surfaces each having a catching piece protruding therefrom and a pair of second surfaces having no catching pieces, the catching pieces engaging with the catching grooves of the substrate, the catching pieces being soldered to the electrodes on the inner surface of the catching grooves. The electronic component is characterized in that the distance X between the second side surfaces of the substrate is shorter than the distance Y between the second surfaces of the shielding case.

According to the fourth preferred embodiment of the invention, the dimension of the shielding case can be increased relative to the dimension of the substrate compared to the known electronic component. Since the areas available to mount elements inside the shielding cases can be expanded, the electronic components can be downsized for the same functions, and the electronic components can be multifunctional with high performance for the same dimensions.

Other features, elements, characteristics, steps and advantages of the present invention will become more apparent from the following detailed description of preferred embodiments of the present invention with reference to the attached drawings.

DETAILED DESCRIPTION OF PREFERRED EMBODIMENTS

Characteristics of the present invention will now be described with reference to preferred embodiments of the present invention.

First Preferred Embodiment

Figure 1A:
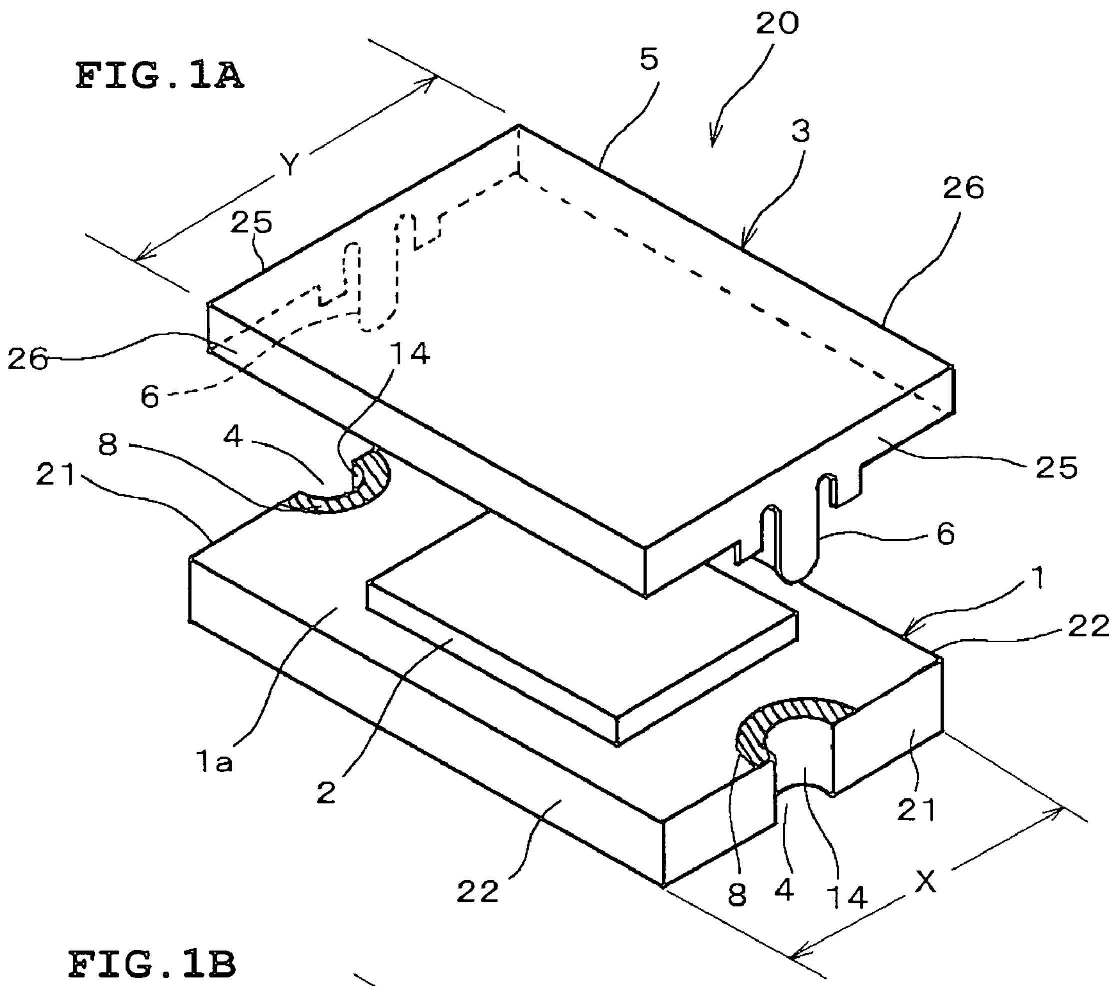
FIG. 1A is a perspective view of an electronic component with a shielding case according to a preferred embodiment of the present invention before the shielding case is soldered to a substrate.

With reference to FIG. 1A, an electronic component 20 with a shielding case according to a first preferred embodiment of the present invention preferably includes a substrate 1, a surface mount device (circuit module) 2 mounted on the top surface 1*a* of the substrate 1, and a shielding case 3 composed of a conductive material and accommodating the substrate 1 and the surface mount device 2.

The substrate 1 is preferably a substantially rectangular plate including a pair of opposed first side surfaces 21 each having a catching groove 4 for mounting the shielding case 3, and a pair of second side surfaces 22 each having no grooves.

The shielding case 3 is preferably substantially rectangular when viewed from the top, and includes a casing body 5 covering the top surface 1*a* of the substrate 1. The casing body 5 includes a pair of opposed first surfaces 25, catching pieces 6 each protruding from the first surfaces 25 for engaging with the catching grooves 4 of the substrate 1, and a pair of second surfaces 26 that are substantially perpendicular to the first surfaces 25 and have no catching pieces. The catching pieces 6 are soldered to electrodes 14 formed on the inner surfaces of the catching grooves 4 while the catching pieces 6 are fitted into the catching grooves 4 of the substrate 1. In this manner, the shielding case 3 is fixed to the substrate 1.

Moreover, in the electronic component according to the first preferred embodiment, the width X between the opposed second side surfaces 22 of the substrate 1 is shorter than the width Y between the opposed second surfaces 26 of the casing body 5 of the shielding case 3.

Figure 1B:
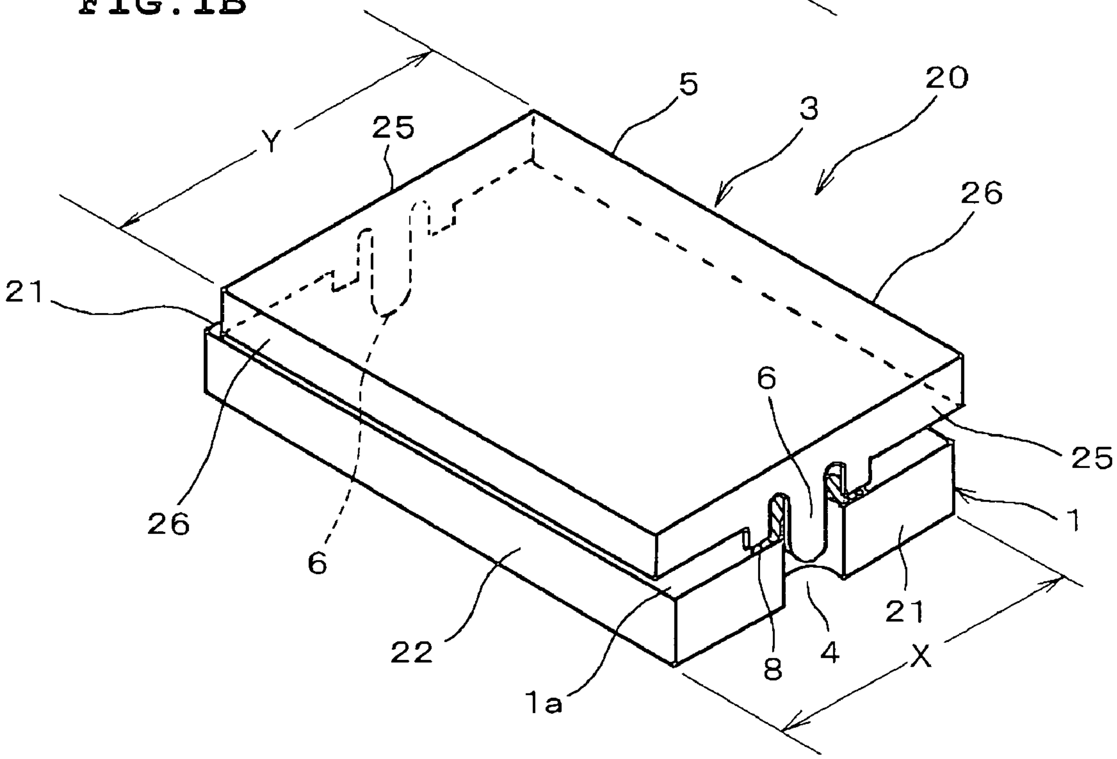
FIG. 1B is a perspective view of the electronic component after the shielding case is soldered to the substrate.
Figure 2:
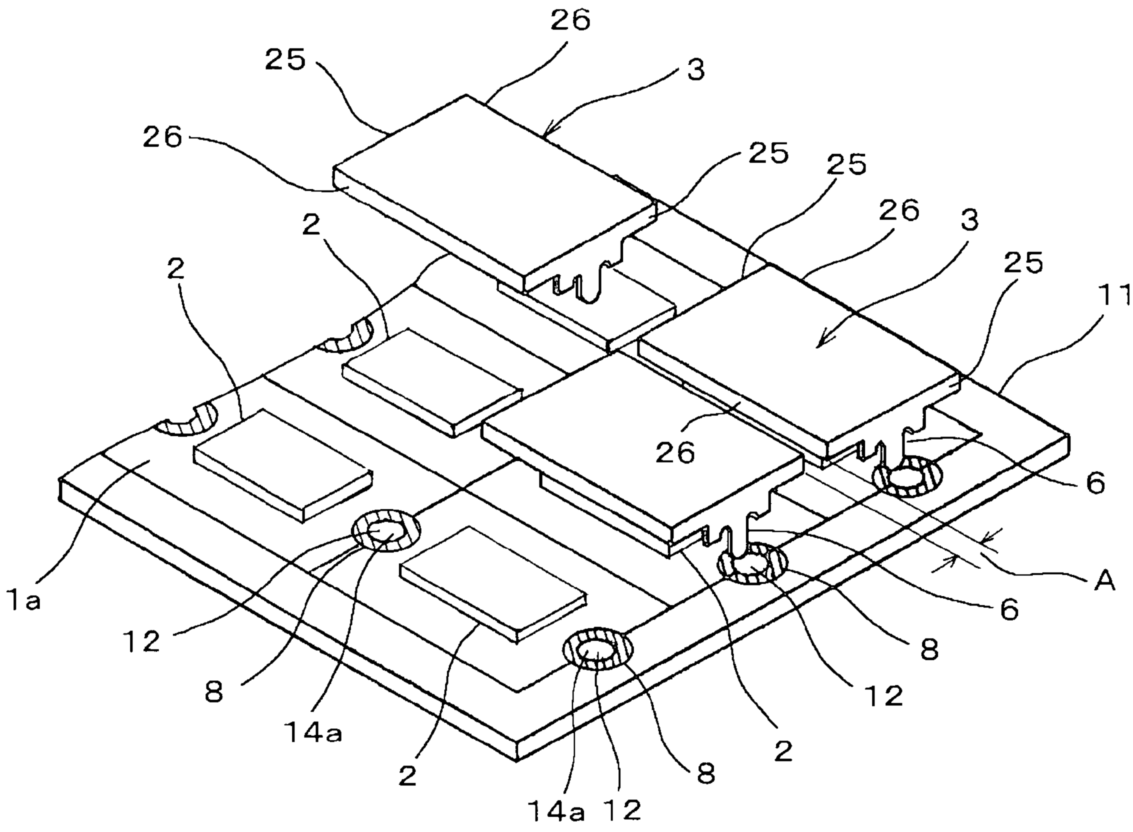
FIG. 2 is a perspective view illustrating a method of manufacturing electronic components with shielding cases according to a preferred embodiment of the present invention.

Next, a method of manufacturing electronic components with shielding cases will now be described. In a first step, as shown in FIG. 2, a plurality of through holes 12 are provided at predetermined positions of a motherboard 11, and land electrodes 8 are formed around the through holes 12 on the top surface 1*a*. Shielding cases 3 each include a casing body 5, catching pieces 6 protruding from a pair of opposed first surfaces 25 of the casing body 5, and a pair of second surfaces 26 that are substantially perpendicular to the first surfaces 25 and have no catching pieces. When the motherboard 11 is divided into substrates 1, the through holes 12 are also divided and form catching grooves 4 on first side surfaces 21 of each substrate 1 (shown in FIGS. 1A and 1B). Electrodes 14*a* are formed on the inner surfaces of the through holes 12, and the electrodes 14*a* form the electrodes 14 on the inner surfaces of the catching grooves 4 after the division of the motherboard 11.

In a second step, surface mount devices 2 are mounted on the motherboard 11. Electrodes of the surface mount devices 2 are soldered to the electrodes or circuits (not shown) on the motherboard 11.

In a third step, the shielding cases 3 are disposed on the motherboard 11 to cover the respective surface mount devices 2. At this time, since the catching pieces 6 of the shielding cases 3 are fitted into the respective through holes 12, i.e. catching grooves 4, and hold the motherboard 11, the shielding cases 3 are preliminarily fixed to the motherboard 11 before soldering. The motherboard can be held more securely by the catching pieces 6 having structures urging the catching pieces 6 into the through holes 12 by an elastic force during engaging. The shielding cases 3 are disposed such that the intervals A between the second surfaces 26 of two adjacent shielding cases 3 are narrower than the widths B of cutting allowances 31 (shown in FIG. 3) formed when the motherboard 11 is cut with a cutting device (a dicing blade 30 shown in FIG. 3).

In a fourth step, the shielding cases 3 are reflow-soldered to the motherboard 11 preferably with a solder cream.

Figure 3:
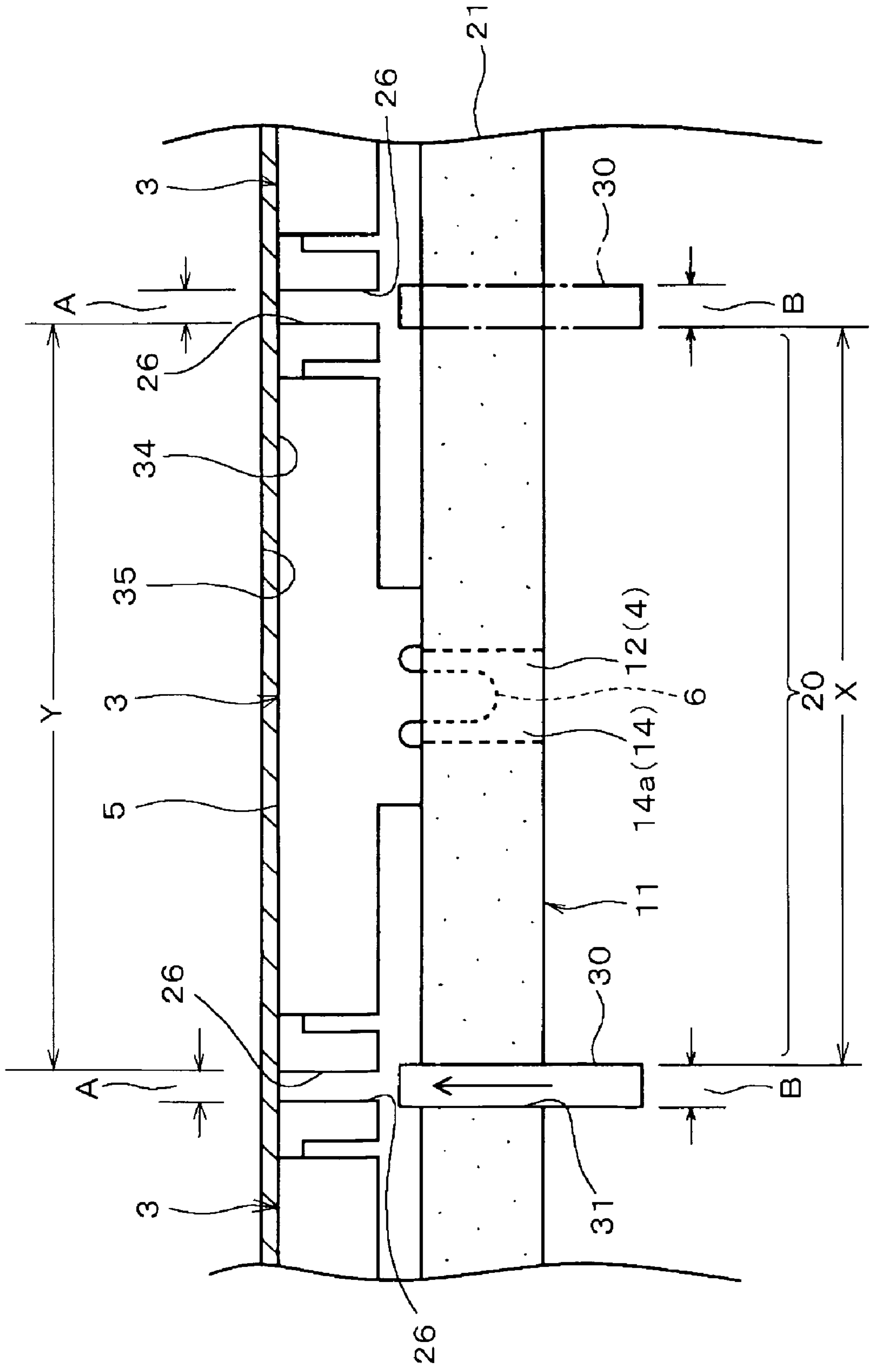
FIG. 3 is a cross-sectional view illustrating a step of dividing a motherboard in the method of manufacturing the electronic components according to a preferred embodiment of the present invention.

In the final step, as shown in FIG. 3, the motherboard 11 is cut along predetermined cutting lines from the back side, i.e. the opposite side of the top surface on which the shielding cases 3 are mounted, with the dicing blade 30 into separate electronic components 20. In this cutting step, the casing bodies 5 are fixed on a dicing table 35 with an adhesive dicer sheet 34 applied between the casing bodies 5 and the dicing table 35 such that the electronic components 20 are not scattered after the division of the motherboard 11. The motherboard 11 is cut in a condition where the elements in FIG. 3 are disposed upside down, i.e. the dicing table 35 is disposed at the bottom. The edge of the dicing blade 30 stops at the gaps between the motherboard 11 and the casing bodies 5, and the dicing blade 30 does not come into contact with the shielding cases 3. The resultant electronic components 20 each have the structure shown in FIG. 1B.

According to the method of manufacturing the electronic component with the shielding case of the first preferred embodiment, the second surfaces 26 of the casing bodies 5 do not have catching pieces. Accordingly, even if the cutting positions around the second surfaces 26 are slightly misaligned during cutting of the motherboard 11, the shielding cases 3 are not cut. Therefore, the distances between the second surfaces 26 of two adjacent shielding cases 3 mounted on the motherboard 11, i.e. the intervals between each shielding case 3, can be reduced for effective use of the motherboard 11.

Figure 4A:
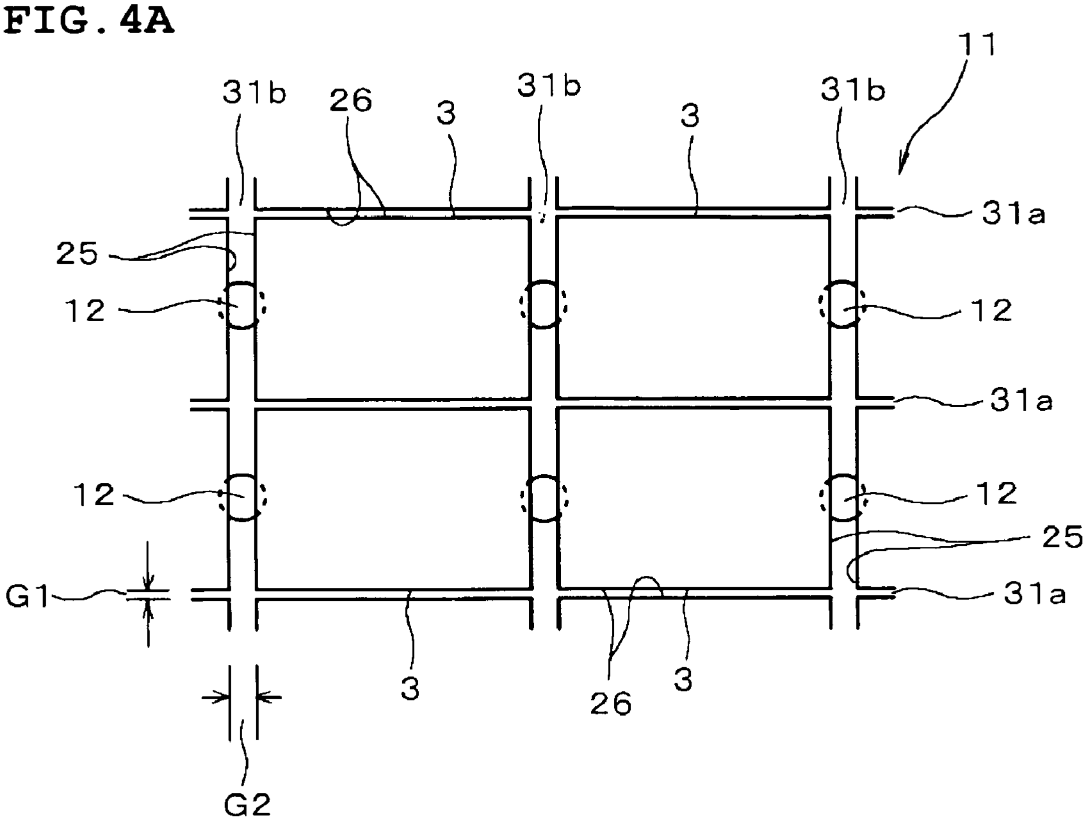
FIG. 4A illustrates the layout of the shielding cases mounted on the motherboard in a step of manufacturing the electronic components according to a preferred embodiment of the present invention.
Figure 4B:
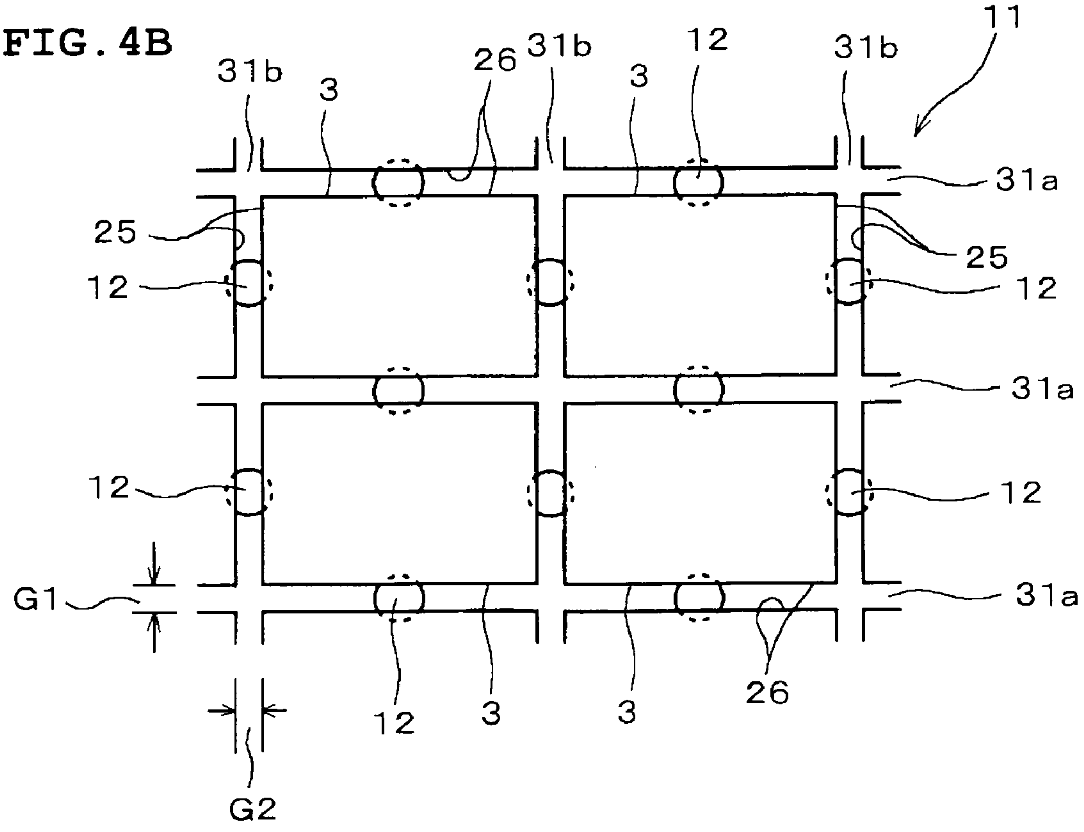
FIG. 4B illustrates the layout of those according to the related art.

FIG. 4A illustrates the layout of the shielding cases 3 mounted on the motherboard according to the first preferred embodiment, and FIG. 4B illustrates the layout of those according to the related art. The shielding cases 3 according to the related art each include catching pieces on all the surfaces. Elements in FIG. 4B having the same reference numerals or symbols as in FIG. 4A are identical or corresponding to those in FIG. 4A. As described above, according to preferred embodiments of the present invention, the catching pieces 6 are formed only on the first surfaces 25 of the shielding cases 3. Accordingly, the widths G1 (the intervals A in FIG. 3) of the boundary regions 31*a* between the second surfaces 26 of two adjacent shielding cases 3 can be narrower than the widths G2 of the boundary regions 31*b* between the first surfaces 25 of two adjacent shielding cases 3, and the motherboard 11 can be put to effective use. When all the surfaces of the shielding cases 3 include the catching pieces as in the case of the related art, the widths G1 cannot be reduced as shown in FIG. 4B (in this case, G1=G2), and the motherboard 11 cannot be effectively utilized.

Moreover, in the cutting step of the motherboard 11 according to the first preferred embodiment, the shielding cases 3 can be arranged such that the intervals A between the second surfaces 26 of two adjacent shielding cases 3 are narrower than the widths B of the cutting allowances 31 formed by the dicing blade 30. Accordingly, the resultant electronic components 20 are small, and each have the width X between opposed second side surfaces 22 of the substrate 1 having no catching grooves shorter than the width Y between the opposed second surfaces 26 of the shielding case 3 having no catching pieces. In other words, the electronic component according to preferred embodiments of the present invention has a shielding case 3 larger than the substrate 1 compared to the known electronic component. Since an area inside the shielding case 3 for mounting parts can be expanded, the electronic component can be downsized for the same functions, and the electronic component can be multifunctional with high performance for the same dimensions.

In the first preferred embodiment, the intervals A between the second surfaces 26 of two adjacent shielding cases 3 are narrower than the widths B of the cutting allowances 31 formed during cutting of the motherboard 11. However, the intervals A and the widths B may be the same. Furthermore, the intervals A can be wider than the widths B unless the intervals A do not exceed the sum of the widths B and margins for various errors such as a positional misalignment during dicing, an initial positional misalignment of the cutting device, and a dimensional deviation of the motherboard.

Second Preferred Embodiment

Figure 5:
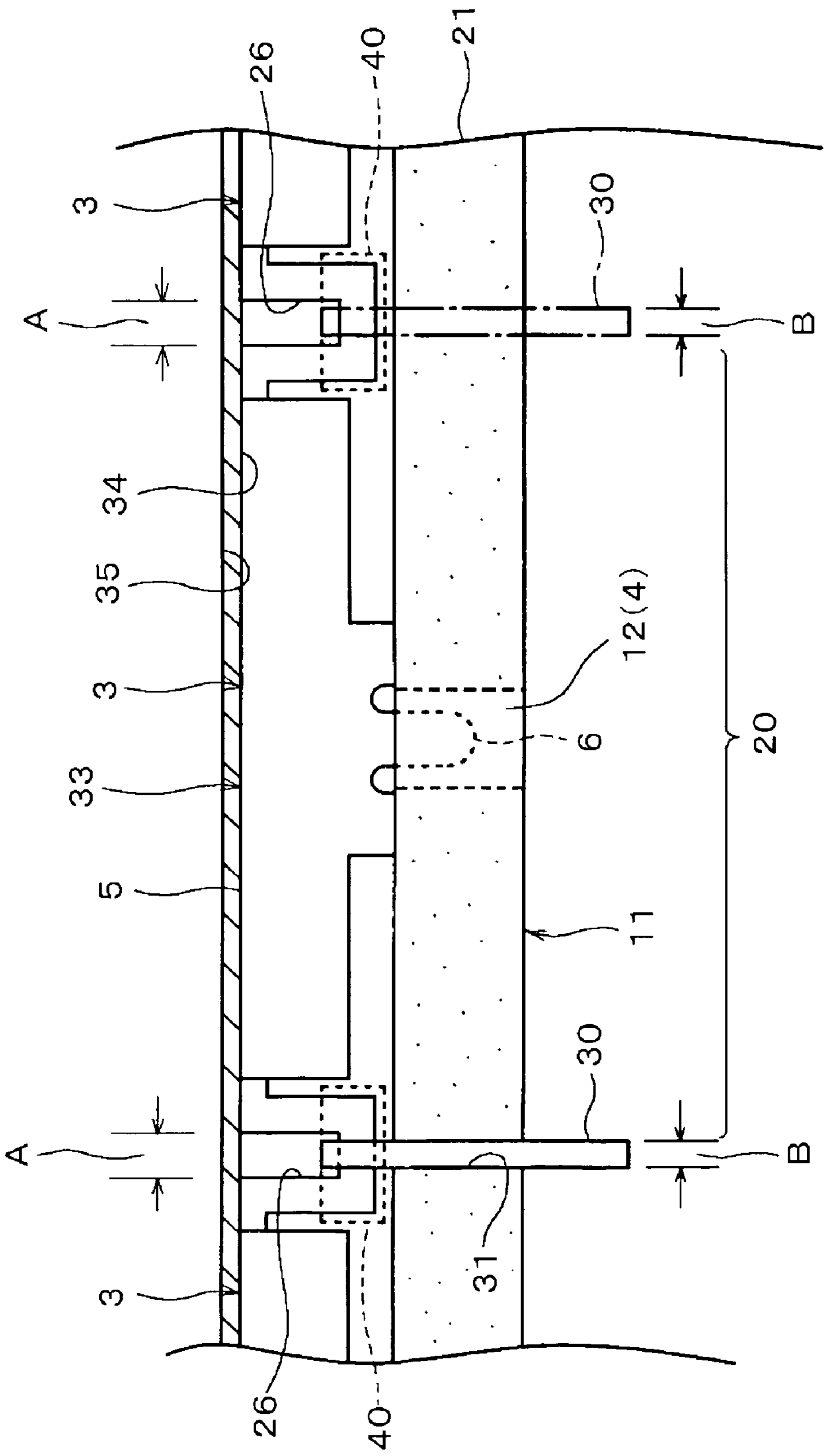
FIG. 5 is a cross-sectional view illustrating a step of dividing a motherboard in a method of manufacturing electronic components with shielding cases according to another preferred embodiment of the present invention.
Figure 6:
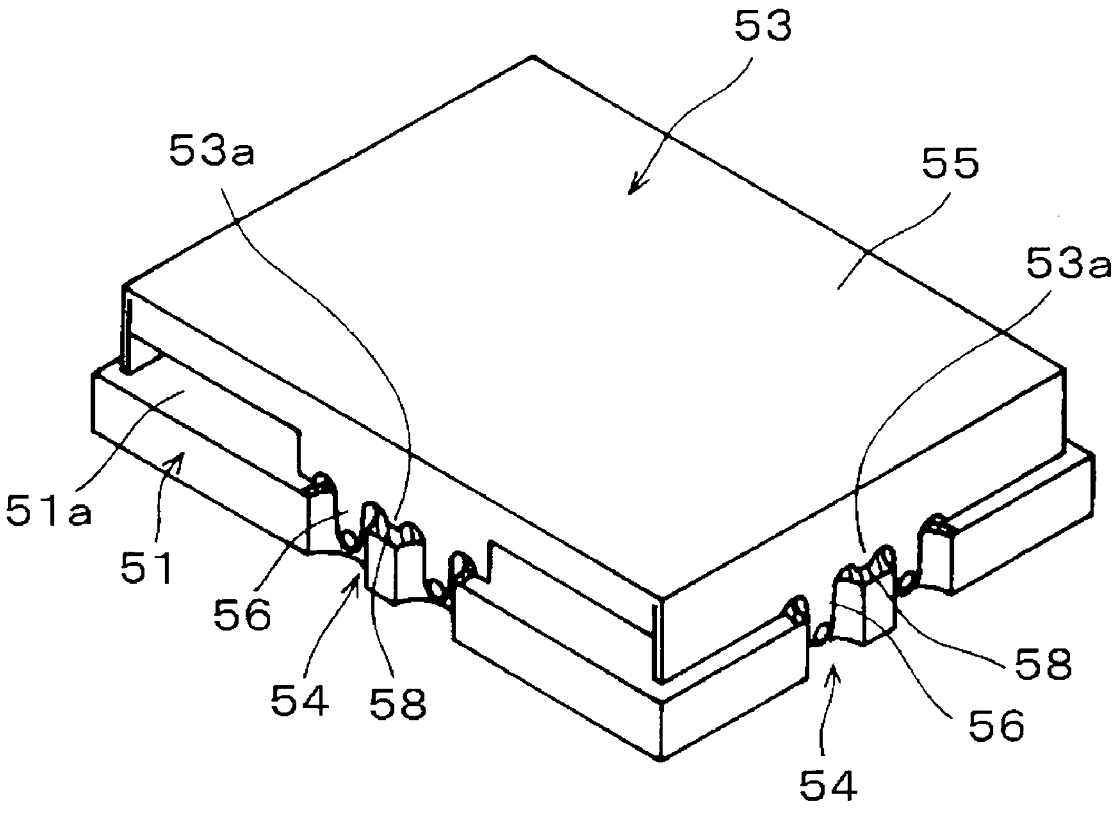
FIG. 6 is a perspective view of the known electronic component with the shielding case.

FIG. 5 is a cross-sectional view illustrating a step of dividing a motherboard in a method of manufacturing electronic components with shielding cases according to a second preferred embodiment of the present invention. In FIG. 5, elements having the same reference numerals or symbols as in FIG. 3 are identical or corresponding to those in FIG. 3.

In the second preferred embodiment, a shielding-case array 33 of shielding cases 3 connected to each other is used. After the shielding-case array 33 is mounted on a motherboard 11, the motherboard 11 is cut with a dicing blade 30 such that the dicing blade 30 reaches connecting portions 40 that connect the shielding cases 3 in the cutting step of the motherboard 11. In this manner, the connecting portions 40 and the motherboard 11 are cut with the dicing blade 30 at the same time.

As described above, by cutting the connecting portions 40 of the shielding-case array 33 at the same time as the division of the motherboard 11, the electronic components 20 can be efficiently produced from the shielding-case array 33. In the second preferred embodiment, in order to cut the connecting portions 40, the shielding cases 3 must be arranged such that the widths B of the cutting allowances 31, i.e. the thickness of the dicing blade 30, are narrower than the intervals A between the second surfaces 26 of two adjacent shielding cases 3. However, this exerts only small effects on the upsizing of the electronic components or a reduction in the number of the electronic components produced from the motherboard.

The present invention is not limited to the above-described preferred embodiments, and various applications or modifications in terms of specific shapes or structures of the board or the shielding case, the number of catching pieces formed on the shielding case, the number or the layout of the surface mount device or the shielding case mounted on the motherboard, the variation of the cutting device for cutting the motherboard, and the like are permissible within the scope of the present invention.

According to various preferred embodiments of the present invention, only the pair of first surfaces of the shielding case has the catching pieces, whereas the pair of second surfaces of the shielding case does not have the catching pieces. Accordingly, the intervals between the second surfaces of two adjacent shielding cases mounted on the motherboard can be reduced for effective use of the motherboard. Moreover, in the cutting step of the motherboard, the shielding cases can be arranged such that the intervals A between the second surfaces of two adjacent shielding cases are narrower than the widths B of the cutting allowances. Accordingly, the resultant electronic components are small and each have the width X between the opposed second side surfaces of the substrate shorter than the width Y between the opposed second surfaces of the shielding case. This can facilitate the effective use of the motherboard and can reduce costs. Therefore, the present invention is widely applicable to electronic components with shielding cases accommodating surface mount devices mounted on the substrates in the same manner as high-frequency composite parts such as VOCs or PLL modules.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A method of manufacturing electronic components with shielding cases, comprising the steps of:

(A) preparing a motherboard including through holes and electrodes formed on the inner surfaces of the through holes;

(B) preparing shielding cases each having a casing body including a pair of opposed first surfaces with catching pieces protruding therefrom and a pair of second surfaces without catching pieces;

(C) mounting the shielding cases on the motherboard by fitting and soldering the catching pieces of the shielding cases to the through holes of the motherboard so as to cover respective substrates formed by dividing the motherboard; and (D) dividing the motherboard into electronic components with shielding cases by cutting the motherboard with a dicing blade from the opposite side of a surface of the motherboard on which the shielding cases are mounted to a depth where the dicing blade does not come into contact with the shielding cases at positions where opposed first side surfaces with catching grooves formed by dividing the through holes are formed on each substrate and at positions where opposed second side surfaces without catching grooves are formed on each substrate.

2. The method according to claim 1, wherein the intervals A between the second surfaces of two adjacent shielding cases mounted on the motherboard are equal to or less than the widths B of cutting allowances at the positions where the opposed second side surfaces without catching grooves are formed on each substrate when the motherboard is cut.

3. The method according to claim 1, wherein when the shielding cases mounted on the motherboard are connected to each other, the connecting portions of the shielding cases are cut during cutting of the motherboard in step (D).

4. The method according to claim 1, wherein when the motherboard is divided into electronic components, the through holes are divided and form the catching grooves.

5. The method according to claim 1, further comprising the step of mounting surface mount devices on the motherboard.

6. The method according to claim 5, wherein the shielding cases cover the surface mount devices.

7. The method according to claim 1, wherein the shielding cases are reflow-soldered to the motherboard.

8. The method according to claim 1, wherein the shielding cases are fixed to the motherboard before soldering thereof.

9. An electronic component with a shielding case, comprising:

a substrate including a pair of opposed first side surfaces each having a catching groove for mounting a shielding case, and a pair of second side surfaces each having no catching grooves, the catching groove being part of a through hole including an electrode on the inner surface thereof, the axial direction of the through hole being approximately along the thickness direction of the substrate;

a surface mount device mounted on the top surface of the substrate; and a shielding case having a casing body covering the top surface of the substrate and fixed to the substrate, the casing body including a pair of opposed first surfaces each having a catching piece protruding therefrom and a pair of second surfaces having no catching pieces, the catching pieces engaging with the catching grooves of the substrate, the catching pieces being soldered to the electrodes on the inner surface of the catching grooves; wherein the distance X between the second side surfaces of the substrate is shorter than the distance Y between the second surfaces of the shielding case; and the second side surfaces of the shielding case are disposed above the top surface of the substrate, and do not extend down the second side surfaces of the substrate.

10. The electronic component with a shielding case according to claim 9, wherein the substrate is substantially rectangular.

11. The electronic component with a shielding case according to claim 9, wherein the shielding case is substantially rectangular.

* * * * *